(12) United States Patent
Park et al.

(10) Patent No.: US 11,403,972 B2
(45) Date of Patent: Aug. 2, 2022

(54) DISPLAY DEVICE

(71) Applicant: SAMSUNG DISPLAY CO., LTD., Yongin-si (KR)

(72) Inventors: Yong Han Park, Yongin-si (KR); Hyun Jung Kim, Yongin-si (KR); Young Ran Son, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/837,503

(22) Filed: Apr. 1, 2020

(65) Prior Publication Data
US 2020/0365063 A1 Nov. 19, 2020

(30) Foreign Application Priority Data

May 17, 2019 (KR) ........................ 10-2019-0058299

(51) Int. Cl.
*G09F 9/30* (2006.01)
*G06F 1/16* (2006.01)
*H01L 51/52* (2006.01)

(52) U.S. Cl.
CPC ............ *G09F 9/301* (2013.01); *G06F 1/1652* (2013.01); *H01L 51/5237* (2013.01)

(58) Field of Classification Search
CPC ...................................................... G06F 3/041
See application file for complete search history.

(56) References Cited

U.S. PATENT DOCUMENTS

| | | | |
|---|---|---|---|
| 7,710,370 | B2 | 5/2010 | Slikkerveer et al. |
| 9,818,805 | B2 | 11/2017 | Choi et al. |
| 9,864,412 | B2 | 1/2018 | Park et al. |
| 10,203,863 | B2 | 2/2019 | Kwon et al. |
| 10,362,689 | B2 | 7/2019 | Cho et al. |
| 2007/0211036 | A1* | 9/2007 | Perkins ................. G06F 1/1677 345/173 |
| 2017/0196102 | A1 | 7/2017 | Shin et al. |
| 2017/0358636 | A1 | 12/2017 | Kim et al. |

FOREIGN PATENT DOCUMENTS

| | | |
|---|---|---|
| KR | 1020160148141 A | 12/2016 |
| KR | 10178835 B1 | 7/2017 |
| KR | 1020170081345 A | 7/2017 |
| KR | 1020170114471 A | 10/2017 |
| KR | 1020170140465 A | 12/2017 |

* cited by examiner

*Primary Examiner* — Jerry Wu
(74) *Attorney, Agent, or Firm* — Cantor Colburn LLP

(57) ABSTRACT

A display device includes a display unit which displays an image, a roller to which an end of the display unit is fixed and which winds or unwinds the display unit by rotating, a housing which accommodates the display unit and the roller, and a guide member which is provided inside the housing and guides a movement of the display unit.

9 Claims, 16 Drawing Sheets

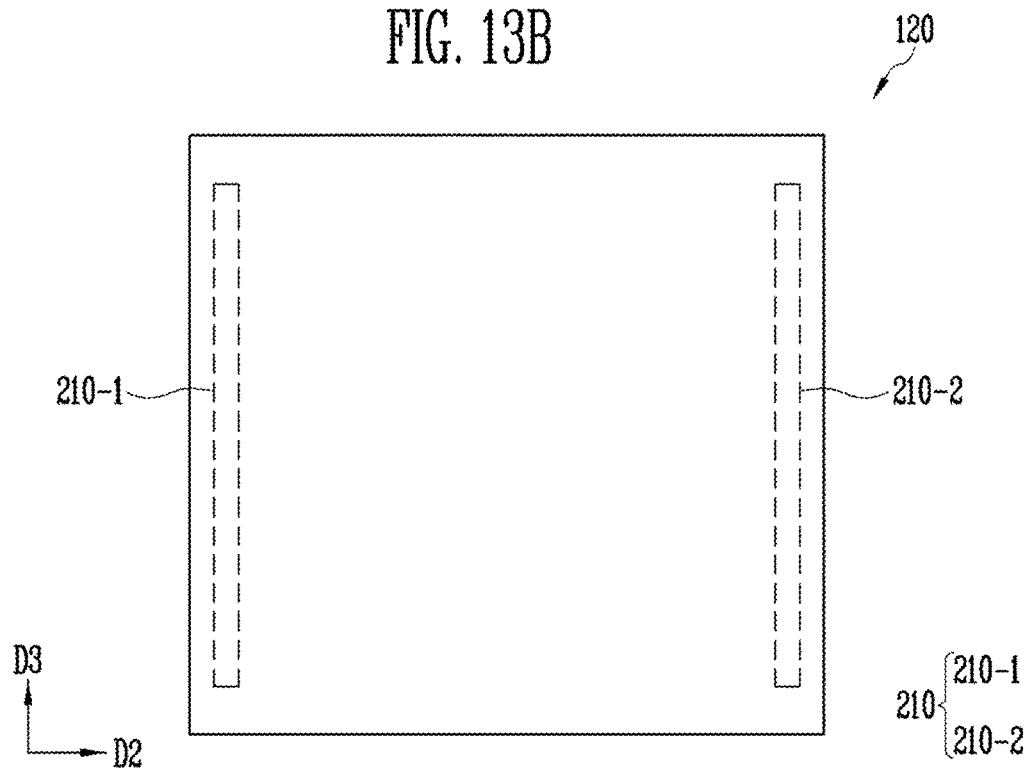
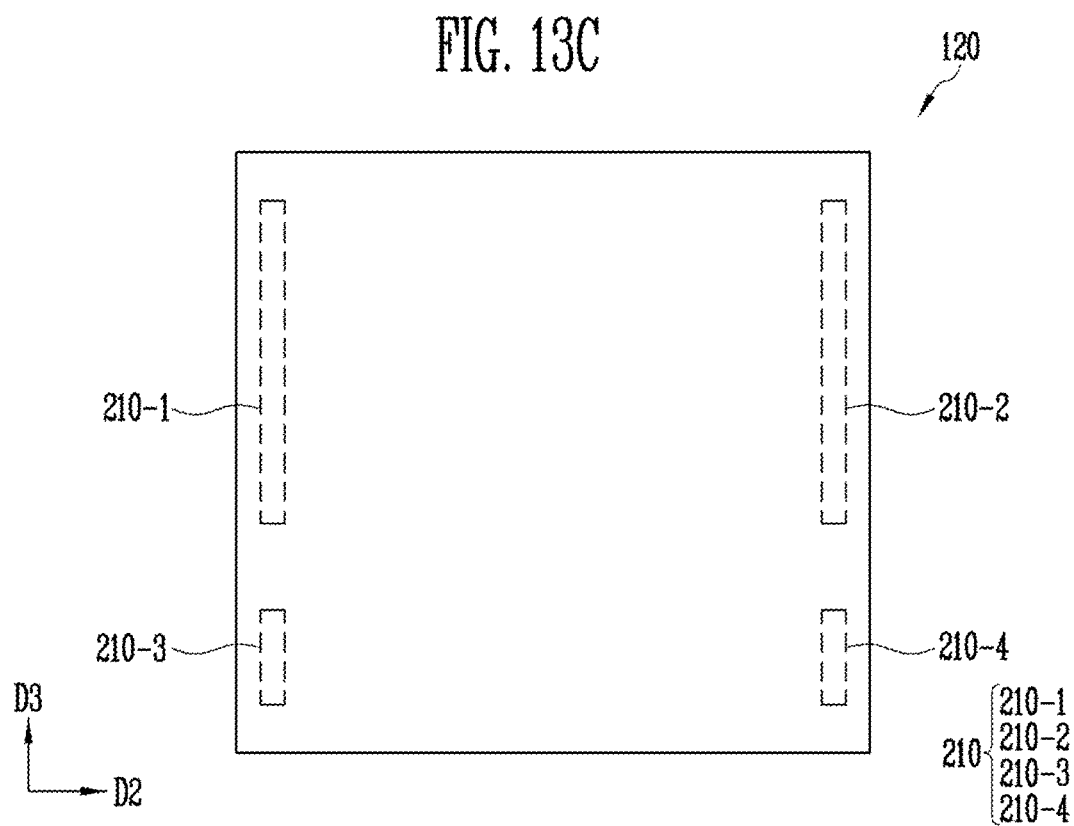

DISPLAY DEVICE

This application claims priority to Korean patent application No. 10-2019-0058299, filed on May 17, 2019, and all the benefits accruing therefrom under 35 U.S.C. § 119, the content of which in its entirety is herein incorporated by reference.

BACKGROUND

1. Field

Various exemplary embodiments of the invention relate to a display device.

2. Description of Related Art

Display devices used for a computer monitor, a television ("TV"), a cellphone, and the like, include an organic light-emitting display, which emits light by itself, a liquid crystal display ("LCD"), which desires a separate light source, and the like.

Display devices are being used not only for computer monitors and TVs but also for personal portable devices, and a range of application thereof becomes more diverse. Accordingly, research on a display device having a large display area and a reduced volume and weight is being conducted.

Also, recently, a rollable display device receives a lot of attention as a next-generation display device. The rollable display device is produced in such a way that a display unit, lines, and the like are formed on a flexible substrate made of a flexible material, such as plastic or the like, thereby enabling an image to be displayed even when the display device is rolled.

SUMMARY

Various exemplary embodiments of the invention are directed to a display device that enables a partial area of a display unit to be used as an information display area by forming a transparent window in the housing of a rollable display device.

Furthermore, various exemplary embodiments of the invention are directed to a display device that may guide a display unit to be prevented from deviating from a designed position when the display unit is wound or unwound.

An exemplary embodiment of the invention provides a display device including a display unit which displays an image, a roller to which an end of the display unit is fixed and which winds or unwinds the display unit by rotating, a housing which accommodates the display unit and the roller, and a guide member which is provided inside the housing and guides a movement of the display unit.

In an exemplary embodiment, the guide member may include an extension part extending in a direction from a first side to a second side of the housing.

In an exemplary embodiment, the guide member may include a first extension part extending in a direction from an upper side to a lower side of the housing.

In an exemplary embodiment, the guide member may further include a second extension part extending in a direction from a first side surface to a second side surface of the housing.

In an exemplary embodiment, an end part of the guide member may extend towards the roller.

In an exemplary embodiment, the display unit may include a display panel, including display elements, and a support member joined to a surface of the display panel and including a metal material.

In an exemplary embodiment, the guide member may include a magnetic part provided in an area thereof and magnetically joined to the support member.

In an exemplary embodiment, the magnetic part may be controlled to be in a turn-off state when the display unit is moving and be controlled to be in a turn-on state when the display unit is not moving.

In an exemplary embodiment, the magnetic part may be disposed along edges of the guide member.

In an exemplary embodiment, the support member may have a multi joint structure including areas rotatably coupled.

In an exemplary embodiment, the magnetic part may be patterned in the guide member correspond to the shapes of the areas.

In an exemplary embodiment, the housing may include a window including a transparent material and provided on a surface of the housing.

In an exemplary embodiment, the display unit may display different images in a first area, disposed outside the housing, and in a second area, disposed adjacent to the window inside the housing, when the display unit is unwound.

In an exemplary embodiment, the display unit may display a piece of information in a first area disposed adjacent to the window inside the housing when the display unit is wound.

In an exemplary embodiment, the first area may be driven in an always-on-display ("AoD") mode.

An exemplary embodiment of the invention provides a display device including a display unit which displays an image, a roller to which an end of the display unit is fixed and which winds or unwinds the display unit by rotating, a housing which accommodates the display unit and the roller, the housing including a window including a transparent material on one surface thereof, and a guide member which is provided inside the housing and guides a movement of the display unit.

In an exemplary embodiment, the display unit may display different images in a first area, disposed outside the housing, and a second area, disposed adjacent to the window inside the housing, when the display unit is unwound.

In an exemplary embodiment, the display unit may display a piece of information in a first area, disposed adjacent to the window inside the housing, when the display unit is wound.

In an exemplary embodiment, the housing may further include a guide member which is provided inside the housing and configured to guide the movement of the display unit.

In an exemplary embodiment, the display unit may be guided to move between the one surface of the housing and the guide member.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which:

FIGS. 13A to 13C are front views illustrating an exemplary embodiment of the magnetic part illustrated in FIG. 12.

DETAILED DESCRIPTION

Figure 1A:
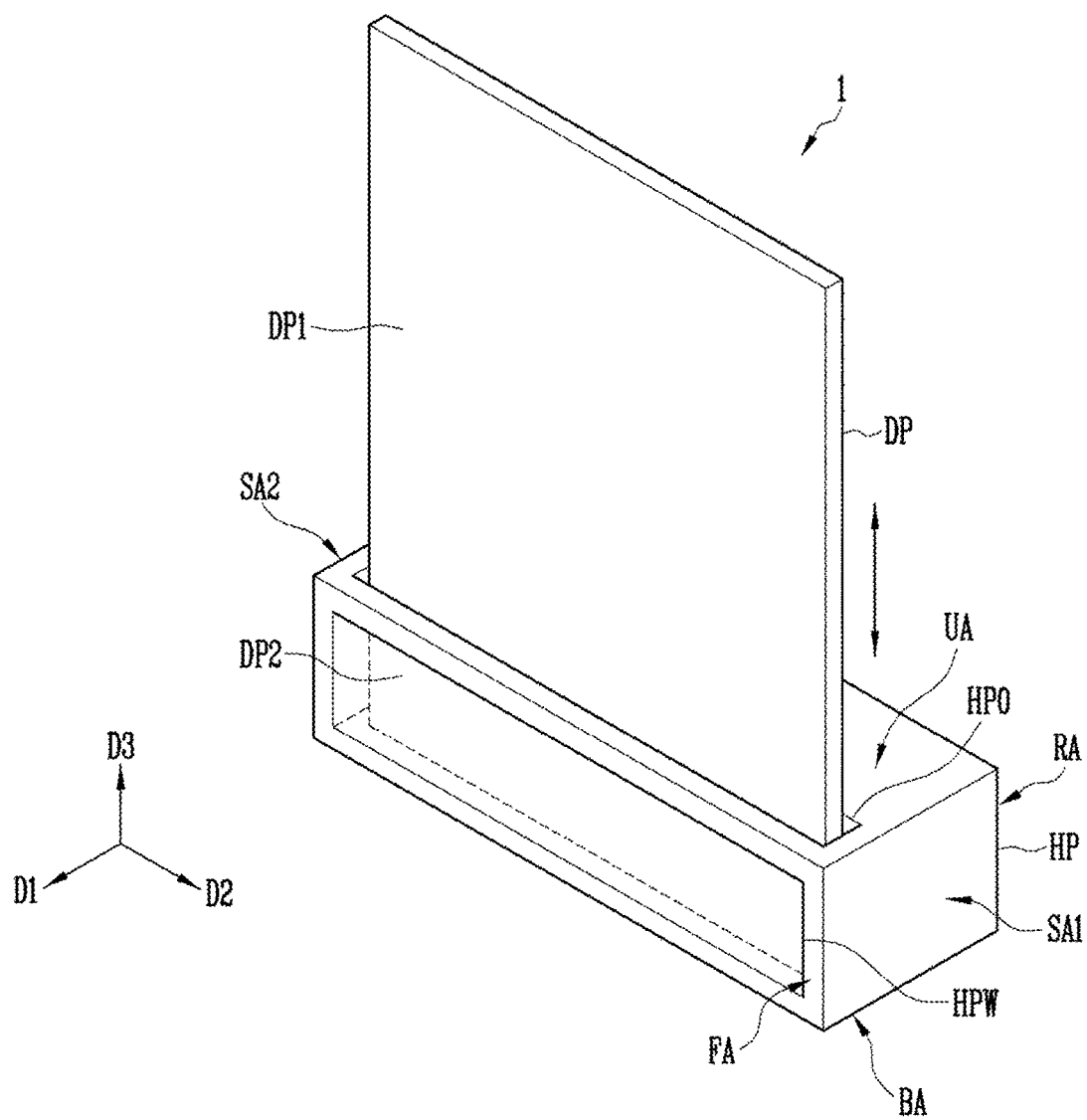
FIGS. 1A and 1B are perspective views of an exemplary embodiment of a display device according to the invention.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular exemplary embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings. In the drawing figures, like reference numerals refer to like elements throughout.

Figure 1B:
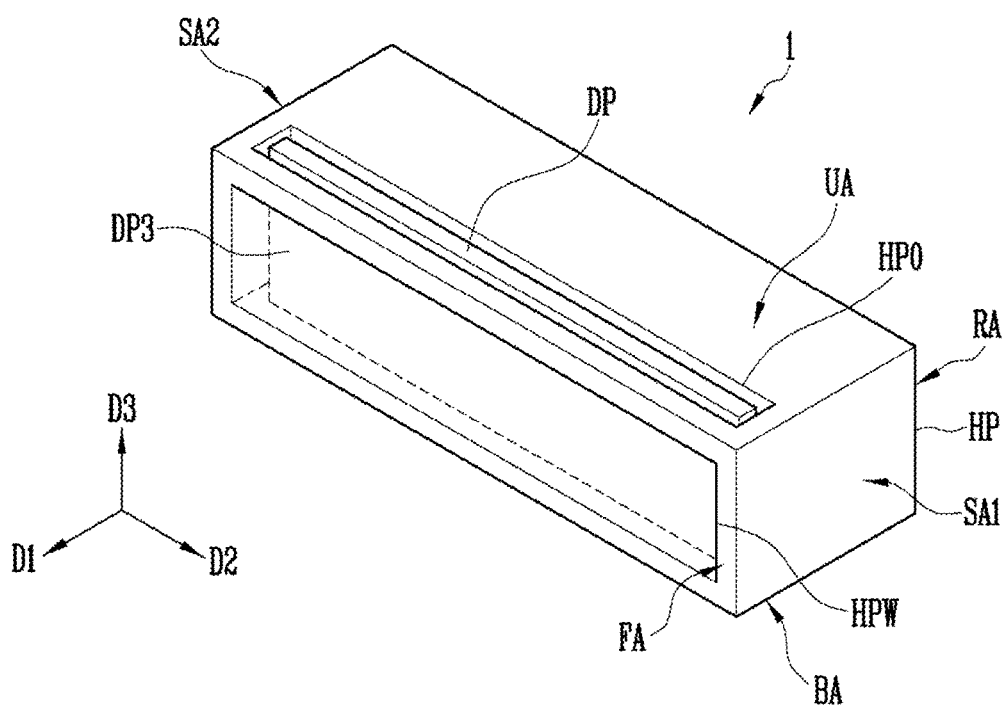

FIGS. 1A and 1B are perspective views of an exemplary embodiment of a display device according to the invention.

Referring to FIGS. 1A and 1B, the display device 1 in an exemplary embodiment of the invention includes a display unit DP and a housing HP.

In the specification, a first directional axis D1, a second directional axis D2, and a third directional axis D3, which are perpendicular to each other, may correspond to an x-axis, a y-axis, and a z-axis, respectively. However, the directions of the first to third directional axes D1, D2 and D3 are relative, and may be changed to other directions. Hereinafter, first to third directions are the directions of the first to third directional axes D1, D2 and D3, and the same reference numerals may be referred to therefor.

The display unit DP is provided for displaying an image to a user. In an exemplary embodiment, display elements, a circuit for driving the display elements, lines, components, and the like may be disposed in the display unit DP, for example. Here, the display device 1 is a rollable display device, and the display unit DP may be capable of being wound or unwound. In an exemplary embodiment, the display unit DP may include a display panel, having flexibility, and a support member such that the display unit DP is capable of being wound or unwound, for example.

The housing HP is a case in which the display unit DP is capable of being accommodated. The housing HP may include a front surface FA and a rear surface RA, which are defined by the second directional axis D2 and the third directional axis D3. The front surface FA and the rear surface RA are opposite to each other. The front surface FA and the rear surface RA may be differentiated from each other by the first directional axis D1. In an exemplary embodiment, the front surface FA is oriented in the first direction, and the rear surface RA is oriented in the direction reverse to the first direction, for example.

The housing HP may further include an upper surface UA and a lower surface BA, which extend between the front surface FA and the rear surface RA. The upper surface UA and the lower surface BA are defined by the first directional axis D1 and the second directional axis D2. The upper surface UA and the lower surface BA may be opposite to each other. Here, the upper surface UA is oriented in the third direction, and the lower surface BA is oriented in the direction reverse to the third direction.

The housing HP may further include two side surfaces SA1 and SA2 enclosed by the front surface FA, the upper surface UA, the rear surface RA, and the lower surface BA. The two side surfaces SA1 and SA2 may be defined by the first directional axis D1 and the third directional axis D3.

In an exemplary embodiment, the housing HP may have the shape of a rectangular parallelepiped extending in the second direction, for example. However, the technical spirit of the invention is not limited thereto, and the housing HP may have any of various shapes, such as a cube and the like.

An opening HPO is defined in the housing HP in order to enable the display unit DP to move inside or outside the housing HP. The opening HPO may be defined in the upper surface UA of the housing HP. In an exemplary embodiment, the opening HPO may be disposed so as to be more adjacent to the front surface FA of the housing HP. The display unit DP may move upwards and downwards (that is, in the third direction and in the direction reverse to the third direction) by passing through the opening HPO of the housing HP.

The display unit DP may be accommodated in the housing HP by being wound, and at least some areas thereof may be disposed outside the housing HP by being unwound. In an exemplary embodiment, the display unit DP of the display device 1 may be switched from a fully unwound state to a fully wound state or from the fully wound state to the fully unwound state, for example.

FIG. 1A illustrates that the display unit DP of the display device 1 is fully unwound. In the fully unwound state, the first area DP1 of the display unit DP of the display device 1 may be disposed outside the housing HP, and the second area DP2 thereof, which is different from the first area DP1, may be disposed inside the housing HP. That is, the fully unwound state may be defined as the state in which the display unit DP is disposed outside the housing HP to the greatest extent as possible by being unwound in order to enable a user to view an image through the display device 1 and in which the display unit DP is no longer capable of being unwound.

FIG. 1B illustrates that the display unit DP of the display device 1 is fully wound. In the fully wound state, the entire display unit DP of the display device 1 is accommodated in the housing HP and is no longer capable of being wound. That is, the fully wound state may be defined as the state in which the display unit DP is not disposed outside the housing HP but accommodated in the housing HP by being wound when a user does not view an image through the display device 1. When a user does not view an image through the display device 1, it is advantageous not to dispose the display unit DP outside the housing HP in terms of appearance, by which the volume of the display device 1 may be reduced and the display device 1 may be easily moved.

The display device 1 may play contents, such as music, radio broadcasting, and the like, even when the display unit DP is fully wound. In such an exemplary embodiment, the display device 1 may operate like a sound box (sound bar) through a built-in speaker in the housing HP. Also, in such an exemplary embodiment, the display device 1 may display brief information through a window HPW, which will be described later.

In various exemplary embodiments of the invention, a transparent window HPW may be provided on the front surface FA of the housing HP. In an exemplary embodiment, the window HPW may include transparent glass, plastic or the like, for example.

One area of the display unit DP disposed inside the housing HP may be visible from the outside through the window HPW. In an exemplary embodiment, when the display unit DP is fully unwound, the second area DP2 disposed inside the housing HP may be visible to a user through the window HPW, for example. Also, when the display unit DP is fully wound, the third area DP3 that is disposed so as to be adjacent to the window HPW may be visible to a user through the window HPW.

In the above-described exemplary embodiment, the area exposed through the window HPW may be controlled so as to display an image that is different from images displayed in other areas. In an exemplary embodiment, in the area exposed through the window HPW, position information, date information, time information, weather information, and information about a currently played or displayed media item (e.g., an image, music, radio broadcasting, or the like) may be displayed in an always-on-display ("AOD") mode, for example. However, the technical spirit of the invention is not limited to the above-described example. A specific embodiment of the above-described operation will be described later with reference to FIGS. 15A and 15B.

In order to switch the display unit DP to a fully unwound state or to a fully wound state, a driver for winding or unwinding the display unit DP may be disposed inside the housing HP. In an exemplary embodiment, the driver may include a roller which winds the display unit DP, a motor which controls the rotation of the roller, and the like, but the configuration thereof is not limited thereto.

Figure 2:
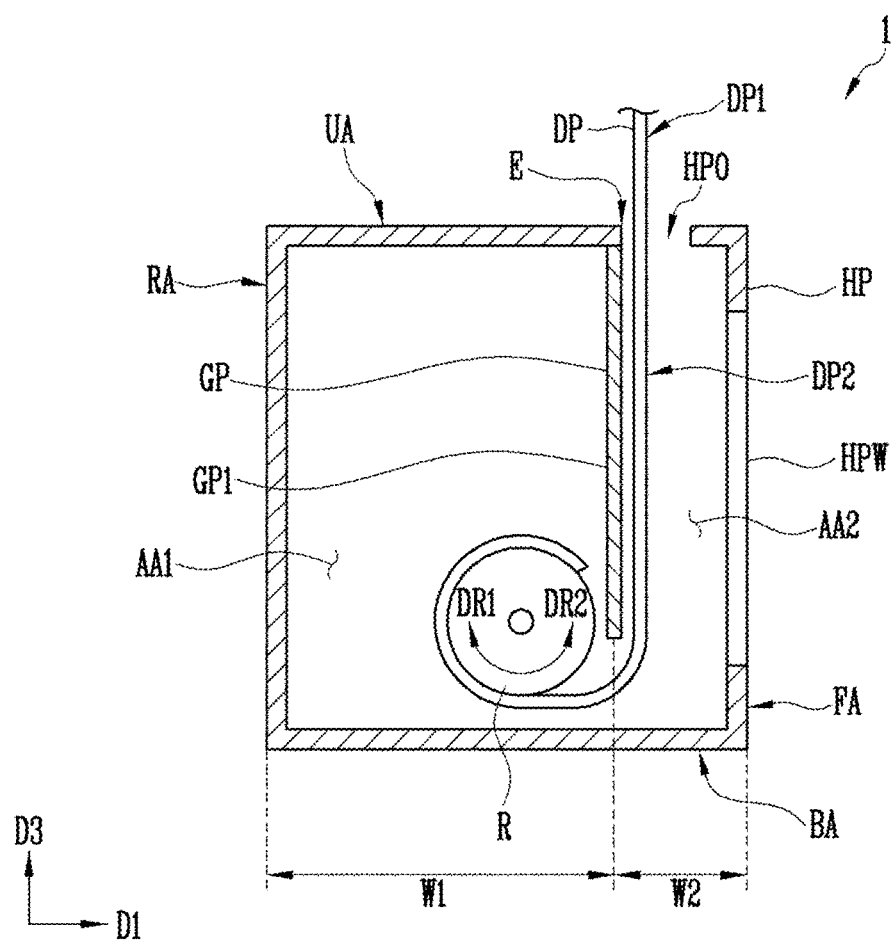
FIG. 2 is a cross-sectional side view of an exemplary embodiment of display device according to the invention.
Figure 3:
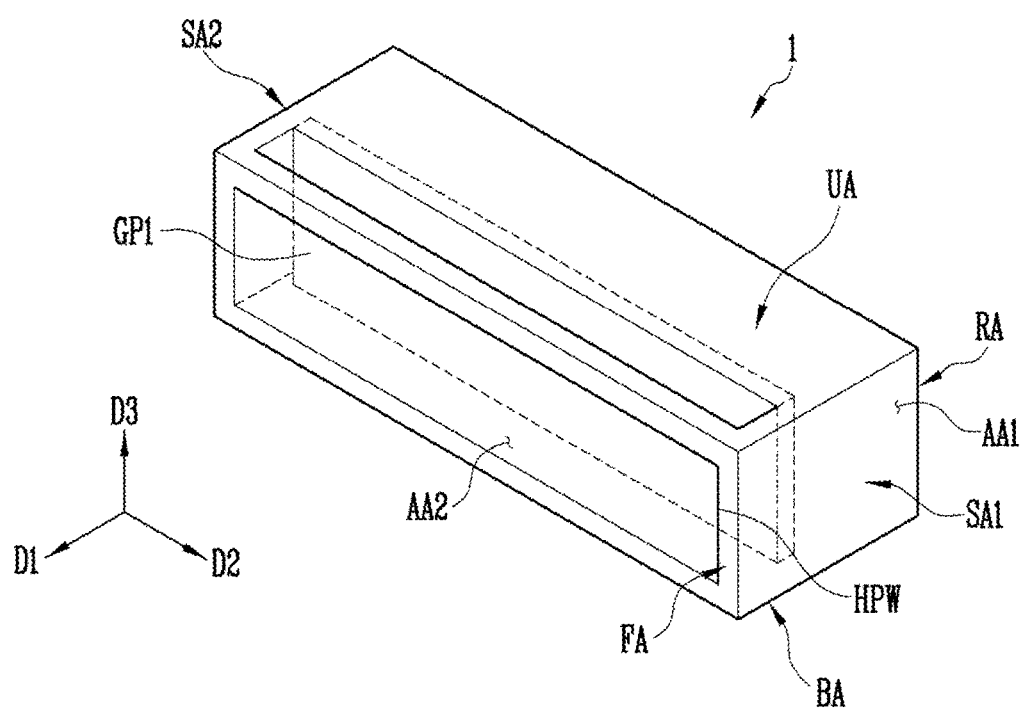
FIG. 3 is a perspective view illustrating an exemplary embodiment of the guide member illustrated in FIG. 2.
Figure 4:
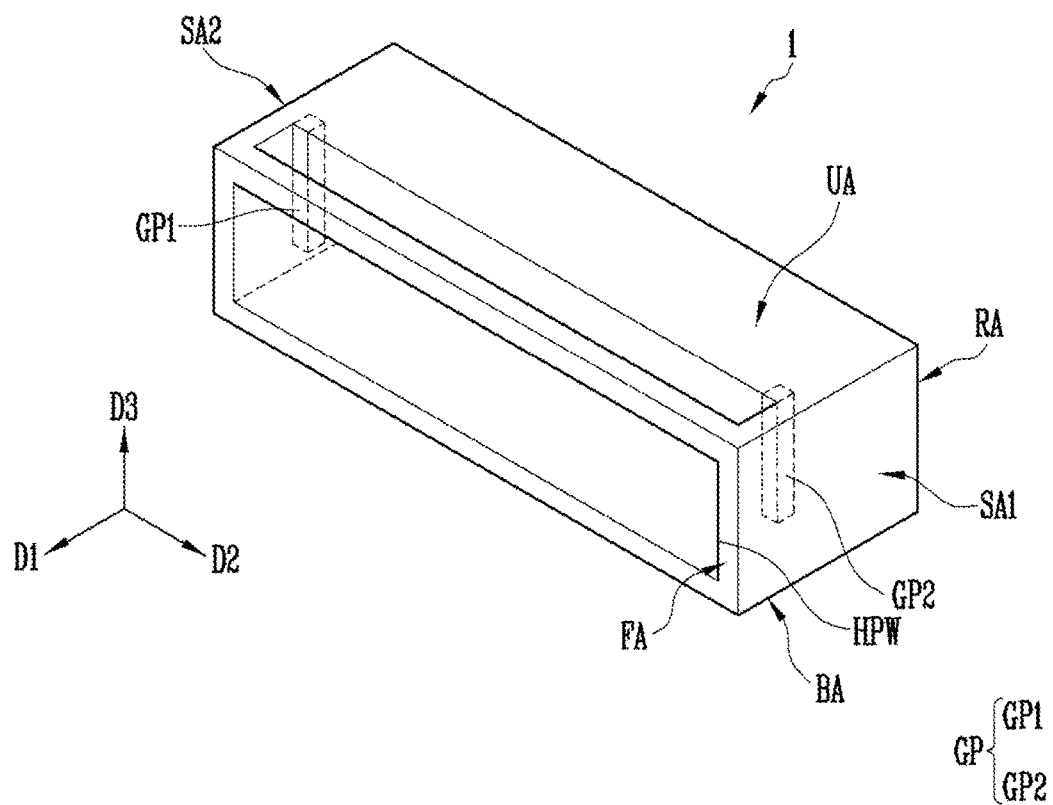
FIG. 4 is a perspective view illustrating another exemplary embodiment of the guide member illustrated in FIG. 2.
Figure 5:
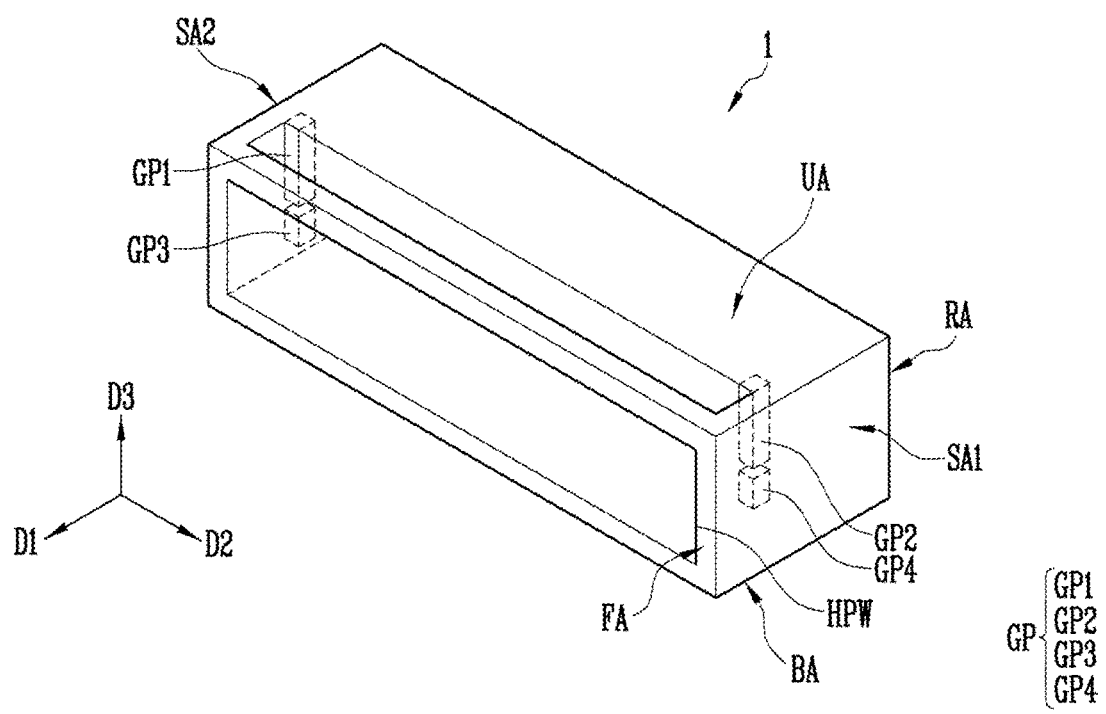
FIG. 5 is a perspective view illustrating another exemplary embodiment of the guide member illustrated in FIG. 2.
Figure 6:
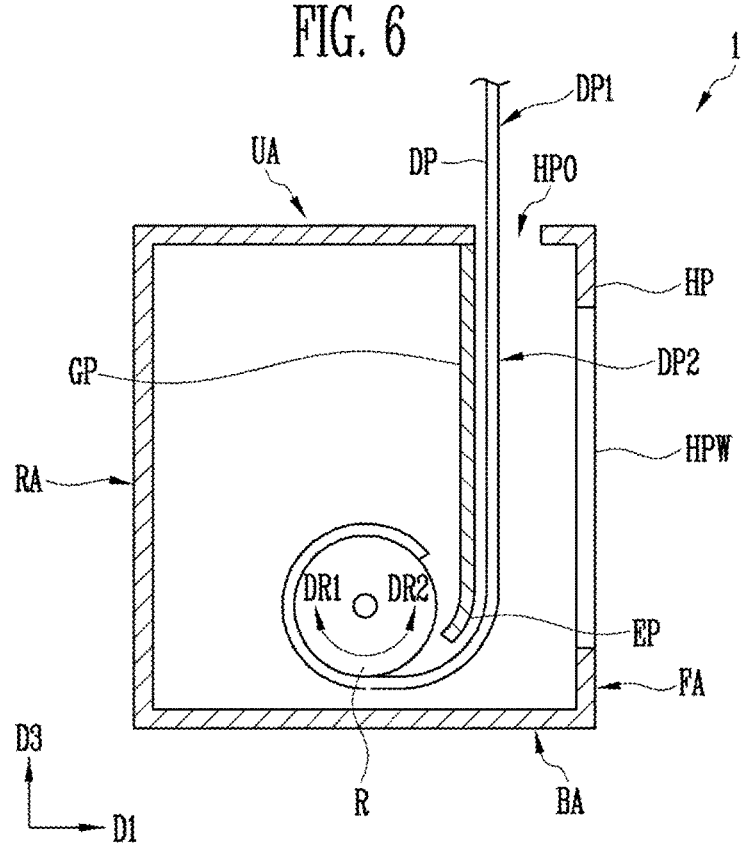
FIG. 6 is a cross-sectional side view illustrating another exemplary embodiment of the guide member illustrated in FIG. 2.

FIG. 2 is a cross-sectional side view of an exemplary embodiment of a display device according to the invention. FIG. 3 is a perspective view illustrating an exemplary embodiment of the guide member illustrated in FIG. 2. FIG. 4 is a perspective view illustrating another exemplary embodiment of the guide member illustrated in FIG. 2. FIG. 5 is a perspective view illustrating another exemplary embodiment of the guide member illustrated in FIG. 2. FIG. 6 is a cross-sectional side view illustrating another exemplary embodiment of the guide member illustrated in FIG. 2.

FIGS. 3 to 5 illustrate only a housing HP and a guide member GP, and other components are omitted in order to show the exemplary shape of the guide member GP provided in the housing HP. Also, only the area visible from the outside through a window HPW and an opening HPO defined in the housing HP is shaded for highlights.

Referring to FIG. 2, in an exemplary embodiment the invention, a guide member GP may be provided in the housing HP of a display device 1, the guide member GP may prevent a display unit DP from colliding with an opening HPO while the display unit DP is moving upwards and downwards (that is, in the third direction and in the direction reverse to the third direction) and may guide the display unit DP so as to move in a designed position. The guide member GP may be provided so as to be adjacent to the front surface FA of the housing HP, and the unwound display unit DP may be guided between the front surface FA of the housing HP and the guide member GP. Accordingly, the display unit DP is capable of moving upwards and downwards in the state in which the display unit DP is tightly close to the front surface FA of the housing HP.

In an exemplary embodiment of the invention, the guide member GP may be provided as a single extension part GP1, which is disposed in such a way that one area of the upper surface UA of the housing HP extends to the inside of the housing HP, as illustrated in FIG. 3. In an exemplary embodiment, the guide member GP may be provided as a single extension part GP1 extending from at least a portion of one edge E of the opening HPO defined in the upper surface UA of the housing HP to the lower surface BA thereof, for example. Here, the one edge E may be an edge that is disposed so as to be close to the rear surface RA of the housing HP. When the opening HPO is defined in the upper surface UA so as to be adjacent to the front surface FA of the housing HP, the extension part GP1 extending from the one edge E of the opening HPO may also be defined so as to be adjacent to the front surface FA of the housing HP. That is, the distance W2 from the guide member GP to the front surface FA of the housing HP is shorter than the distance W1 from the guide member GP to the rear surface RA of the housing HP.

In such an exemplary embodiment, the inside of the housing HP may be partitioned into two areas AA1 and AA2 by the guide member GP, and the area AA2 adjacent to the front surface FA of the housing HP, among the partitioned areas, may define the opening HPO in the upper surface UA. The display unit DP is guided along the inside of the partitioned area AA2 in which the opening HPO is defined, and one area DP1 thereof may be exposed upwardly by passing through the opening HPO.

In another exemplary embodiment, the guide member GP may be provided as two extension parts GP1 and GP2, each of which extends from one area of the upper surface UA of the housing HP (e.g., a portion of one edge E of the opening HPO) to the inside of the housing HP, as illustrated in FIG. 4. Among the extension parts GP1 and GP2, the first extension part GP1 may be provided so as to be adjacent to one side surface SA1 of the housing HP, and the second extension part GP2 may be provided so as to be adjacent to the other side surface SA2 of the housing HP. In such an exemplary embodiment, the opposite side edges of the display unit DP may be guided between the front surface FA of the housing HP and the respective extension parts GP1 and GP2. When the guide member GP is provided as illustrated in FIG. 4, the up/down movement of the display unit DP may be guided, and more space may be secured in the housing HP, compared to the exemplary embodiment of FIG. 3, whereby the usability of the housing HP may be improved.

In an exemplary embodiment, the guide member GP may be provided as two extension parts GP1 and GP2, each of which extends from one area of the upper surface UA of the housing HP (e.g. one edge E of the opening HPO) to the inside, and additional two extension parts GP3 and GP4, each of which extends from one area of each of the opposite side surfaces SA1 and SA2 of the housing HP to the inside, as illustrated in FIG. 5. In such an exemplary embodiment, the opposite side edges of the display unit DP may be guided between the front surface FA of the housing HP and the four extension parts GP1, GP2, GP3 and GP4. When the guide member GP is provided as illustrated in FIG. 5, it is possible to make better use of the inner space of the housing HP, compared to the exemplary embodiment illustrated in FIG. 4, and the part of the guide member GP visible from the outside through the window HPW of the front surface FA may be minimized.

However, the shape and the number of guide members GP are not limited to the examples illustrated in FIGS. 3 to 5. That is, the shape and the number of guide members GP may be variously changed as long as the structure thereof enables the display unit DP to be guided so as to be tightly close to the front surface FA of the housing HP while the display unit DP is moving upwards and downwards.

FIGS. 2 to 5 illustrate an example in which the guide member GP linearly extends from the upper surface UA of the housing HP, but the technical spirit of the invention is not limited thereto. That is, in an exemplary embodiment, the guide member GP may be provided such that the end part EP thereof, which is adjacent to the lower surface BA of the housing HP, extends in a curve towards the roller R, that is, towards the rear surface RA of the housing HP, as illustrated in FIG. 6. In this case, because the display unit DP moves along the curved surface when it is guided at the end part EP of the guide member GP, the display unit DP may be prevented from being damaged.

FIGS. 2 to 6 illustrate an example in which the guide member GP extends from at least one side of the housing HP to the other side thereof, but the technical spirit of the invention is not limited thereto. That is, in other exemplary embodiments of the invention, the guide member GP may be indirectly joined to at least one side of the housing HP by a coupling member or the like.

In various exemplary embodiments of the invention, the guide member GP may be provided such that at least one area thereof has a magnetic property. Due to the magnetic property of the guide member GP, the display unit DP moving along the guide member GP may be stably supported. Such an exemplary embodiment will be more specifically described later with reference to FIGS. 12 to 14.

Referring back to FIG. 2, a driver for winding or unwinding the display unit DP may be disposed inside the housing HP.

In an exemplary embodiment, the driver may include a roller R. The roller R winds or unwinds the display unit DP, which is fixed to the roller R, by rotating in a first rotational direction DR1 or a second rotational direction DR2. In an exemplary embodiment, the roller R may have a cylindrical shape, and may be disposed so as to be adjacent to the lower surface BA of the housing HP. In an exemplary embodiment, a fixing member for fixing the roller R at a designed position, or the like may be further provided.

The bottom edge of the display unit DP may be fixed to the roller R. When the roller R is rotated in the first rotational direction DR1, that is, in a clockwise direction, by a motor or the like, the display unit DP may be wound around the roller R such that the rear surface of the display unit DP is tightly adhered to the surface of the roller R.

Conversely, when the roller R is rotated in the second rotational direction DR2, that is, in an anticlockwise direction, by the motor or the like, the display unit DP, wound around the roller R, is unwound from the roller R, thereby being exposed outside the housing HP.

In an exemplary embodiment, a driver having a different structure from that of the above-described driver may be applied in the display device 1. That is, as long as the driver is able to wind or unwind the display unit DP, the configuration of the driver may be changed, some components thereof may be omitted, or another component may be added thereto.

Figure 7:
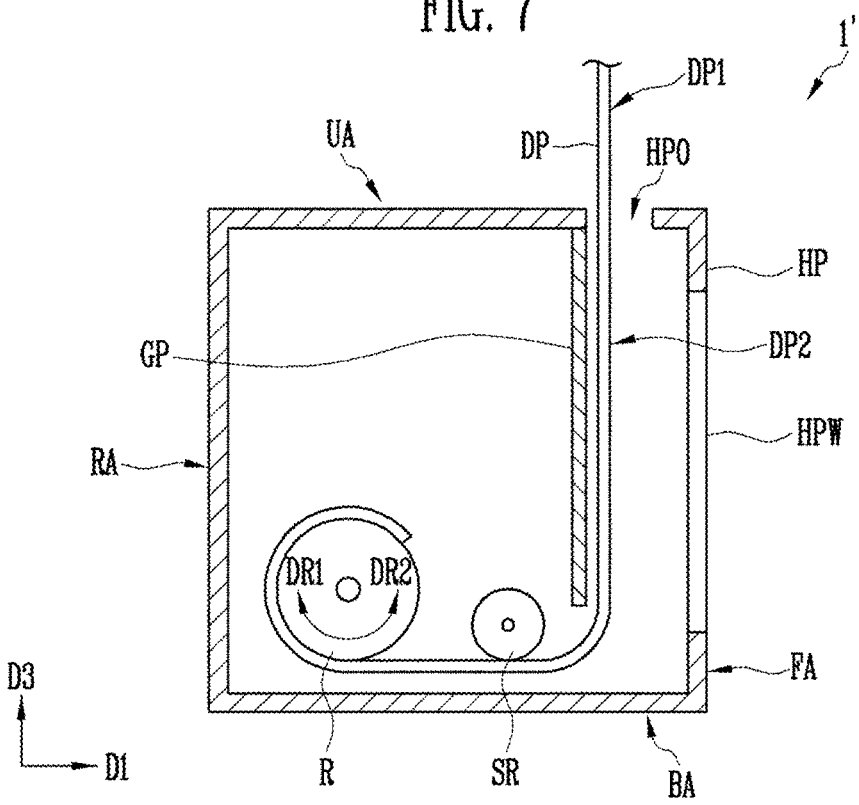
FIG. 7 is a cross-sectional side view of another exemplary embodiment of a display device according to the invention.

FIG. 7 is a cross-sectional side view of another exemplary embodiment of a display device according to the invention. The display device 1' of FIG. 7 is the same as the display device 1 of FIG. 2 except that the driver of the display device 1' further includes an auxiliary roller SR, and thus a repeated description will be omitted.

Referring to FIG. 7, the auxiliary roller SR may be disposed between the front surface FA of the housing HP and the roller R. The auxiliary roller SR rotates in the same direction as the roller R when the roller R rotates, thereby helping the display unit DP to move. The auxiliary roller SR may support the display unit DP such that the display unit DP remains flat along the lower surface BA of the housing HP when it is wound or unwound by the roller R.

FIG. 7 illustrates only a single auxiliary roller SR, but in various exemplary embodiments, multiple auxiliary rollers SR may be provided. Also, FIG. 7 illustrates an example in which the auxiliary roller SR is smaller than the roller R, but in various exemplary embodiments, the size of the auxiliary roller SR may be equal to or greater than the size of the roller R.

Figure 8:
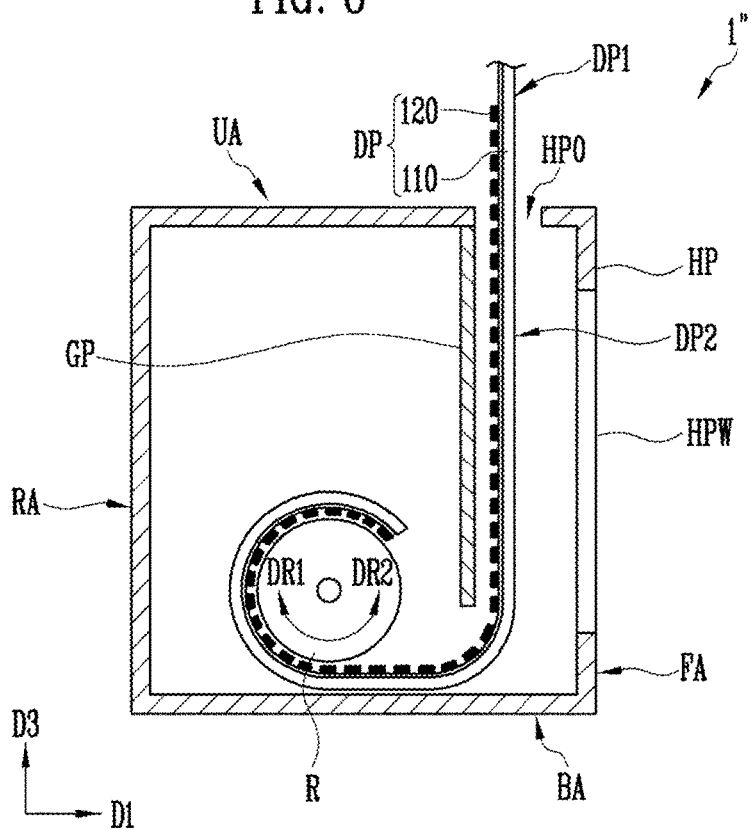
FIG. 8 is a cross-sectional side view of another exemplary embodiment of a display device according to the invention.
Figure 9:
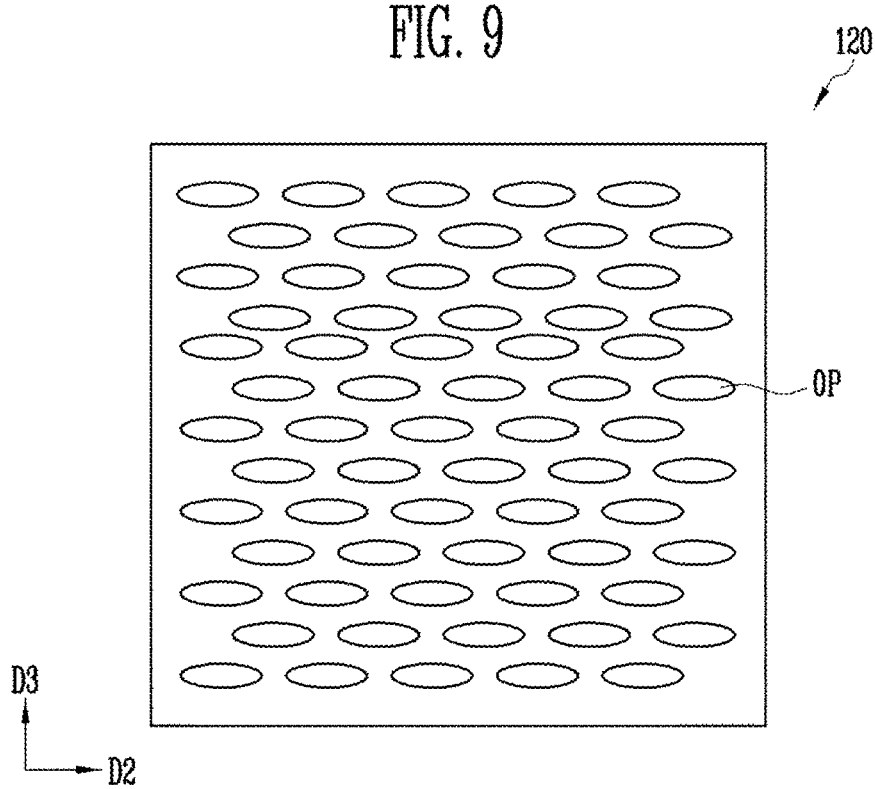
FIG. 9 is a front view illustrating an exemplary embodiment of the support member illustrated in FIG. 8.
Figure 10:
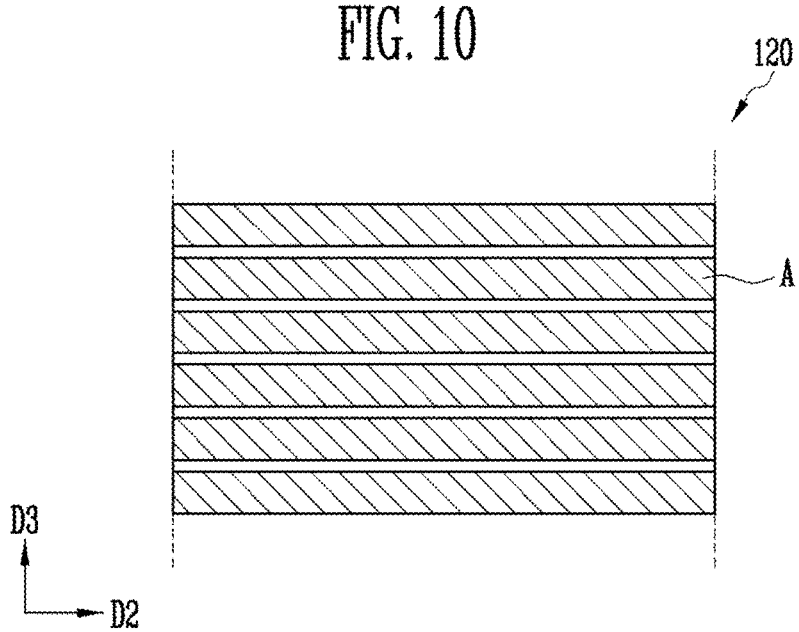
FIG. 10 is a front view illustrating another exemplary embodiment of the support member illustrated in FIG. 8.

FIG. 8 is a cross-sectional side view of another exemplary embodiment of a display device according to the invention. FIG. 9 is a front view illustrating an exemplary embodiment of the support member illustrated in FIG. 8. FIG. 10 is a front view illustrating another exemplary embodiment of the support member illustrated in FIG. 8.

The display device 1" of FIG. 8 is the same as the display device 1 of FIG. 2 except that the display unit DP is provided with a display panel 110 and a support member 120, and thus a repeated description will be omitted.

Referring to FIG. 8, the display unit DP may include a display panel 110 and a support member 120 joined to the rear surface of the display panel 110.

The display panel 110 may display an image. The display panel 110 may include display elements for displaying an image, a driving element for driving the display elements, lines for transmitting various types of signals to the display elements and the driving element, and the like. The display elements may be defined differently depending on the type of the display panel 110, and may be, for example, organic light-emitting elements, liquid crystal display elements, or the like. Because the display device 1" in an exemplary embodiment of the invention is a rollable display device, the display panel 110 may be implemented as a flexible display panel.

The support member 120 is joined to the rear surface of the display panel 110, thereby functioning as a back cover. The support member 120 may include a rigid material, but at least one portion thereof may have flexibility so as to be wound or unwound along with the display panel 110. In an exemplary embodiment, the support member 120 may include a flexible plastic material, such as polyimide ("PI") or the like, as illustrated in FIG. 9, for example. In such an exemplary embodiment, openings OP may be defined in the support member 120, which may thus be more flexibly changed depending on the stresses applied to the display unit DP.

In an alternative exemplary embodiment, for example, the support member 120 may include a material, such as metal, plastic, or the like, and may include areas A that are coupled so as to be rotatable, as illustrated in FIG. 10. That is, the support member 120 may have a multi joint structure and include a material such as metal, plastic or the like. In such an exemplary embodiment, the areas A may be joined to each other using hinges or an adhesive, which has flexibility when it is cured. In such an exemplary embodiment, the areas A may be rotated towards each other in response to the change of the shape of the display unit DP.

In an exemplary embodiment, the respective areas A may be alternately disposed in the third direction along with the third directional axis D3. In an exemplary embodiment, each of the areas A may have a bar shape, for example, but the shape thereof is not limited thereto. When the display unit DP is fully unwound, the respective areas A of the support member 120 joined to the display unit DP may be spaced apart from each other or disposed such that the side surfaces thereof are in contact with each other. However, the technical spirit of the invention is not limited to this example.

Such a support member 120 prevents the display unit DP from vibrating and enables the display unit DP to remain flat when the display unit DP is moving upwards and downwards.

Figure 11A:
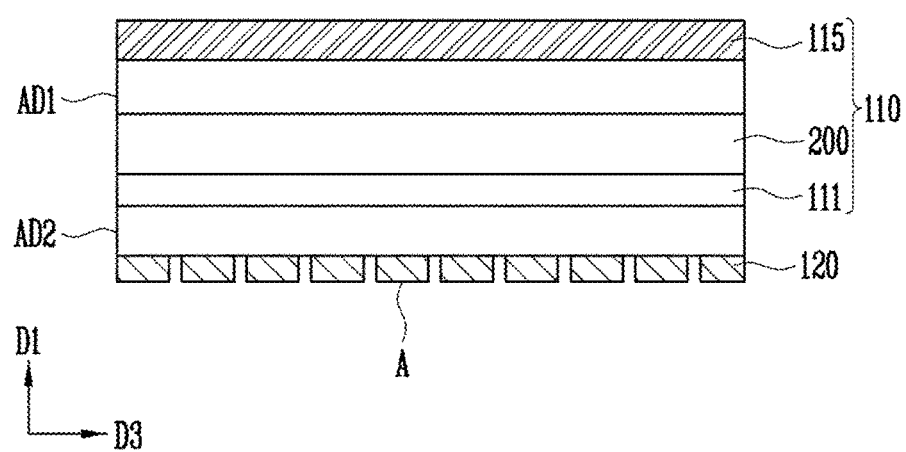
FIG. 11A is a cross-sectional view illustrating an exemplary embodiment of the display unit illustrated in FIG. 8.

FIG. 11A is a cross-sectional view illustrating an exemplary embodiment of the display unit illustrated in FIG. 8.

Referring to FIG. 11A, the display panel 110 includes a substrate 111, a display layer 200, and a window 115 (or window layer, cover layer).

The substrate 111 is a base member for supporting various configurations of the display panel 110, and may include an insulation material. In an exemplary embodiment, the substrate 111 may include a flexible material in order to enable the display panel 110 to be wound or unwound, and may include, for example, a plastic material, such as PI, polyamide ("PA"), polyethylene terephthalate ("PET"), or the like.

The display layer 200 includes elements and lines forming pixels and layers for insulating or protecting the elements and lines. The display layer 200 may include switching elements, such as transistors, and light-emitting elements, such as organic light-emitting diodes ("OLEDs"). The detailed structure of the display layer 200 will be described in detail with reference to FIG. 13.

The window 115 is disposed on the display layer 200. The window 115 protects the elements and lines forming the pixels and the layers for insulating or protecting the elements and lines. The window 115 may transmit an image from the pixels while protecting the organic light-emitting elements of the pixels from external moisture, oxygen, shock, or the like, and may provide protection against external shocks and scratches.

A first adhesive layer AD1 may be disposed between the display layer 200 and the window 115. The first adhesive layer AD1 may bond the display layer 200 and the window 115. The first adhesive layer AD1 includes an adhesive material, and may be a thermosetting or self-curing adhesive. In an exemplary embodiment, the first adhesive layer AD1 may include an optical clear adhesive ("OCA"), a pressure sensitive adhesive ("PSA"), or the like, for example, but the first adhesive layer AD1 is not limited thereto.

The first adhesive layer AD1 may be disposed so as to cover the display layer 200 and the pixel unit. In such an exemplary embodiment, the first adhesive layer AD1 may protect the light-emitting elements of the pixels from external moisture, oxygen, shock or the like, along with the window 115. Here, the first adhesive layer AD1 may further include a moisture absorbent. The moisture absorbent may be particles having moisture-absorbing properties, and may absorb moisture, oxygen, or the like from the outside, thereby minimizing moisture and oxygen permeating the pixels.

Although not illustrated in FIG. 11A, a light-transmissive film may be further disposed above the window 115. The light-transmissive film may function to protect the front surface of the display panel 110 and to minimize reflection of external light incident to the display panel 110. In an exemplary embodiment, the light-transmissive film may be at least one of a PET film, an antireflective film, a polarizing film, and a transmittance-controllable film, for example, but the light-transmissive film is not limited thereto.

The support member 120 is disposed under the substrate 111. The support member 120 may be disposed so as to be in contact with the substrate 111 of the display panel 110. The structure of the support member 120 is as described above. That is, the support member 120 may be provided with areas A disposed along the third directional axis D3. In various exemplary embodiments, the support member 120 may be bonded to the display panel 110 by a second adhesive layer AD2.

In such an exemplary embodiment, the second adhesive layer AD2 is disposed between the substrate 111 and the support member 120. The second adhesive layer AD2 may bond the substrate 111 and the support member 120. The second adhesive layer AD2 includes an adhesive material, and may be a thermosetting or self-curing adhesive. In an exemplary embodiment, the second adhesive layer AD2 may include an OCA, a PSA, or the like, for example, but the second adhesive layer AD2 is not limited thereto. In another exemplary embodiment of the invention, the support member 120 may be joined to the display panel 110 using a physical coupling method, and may be detachable from the display panel 110. In such an exemplary embodiment, the second adhesive layer AD2 may be omitted.

Figure 11B:
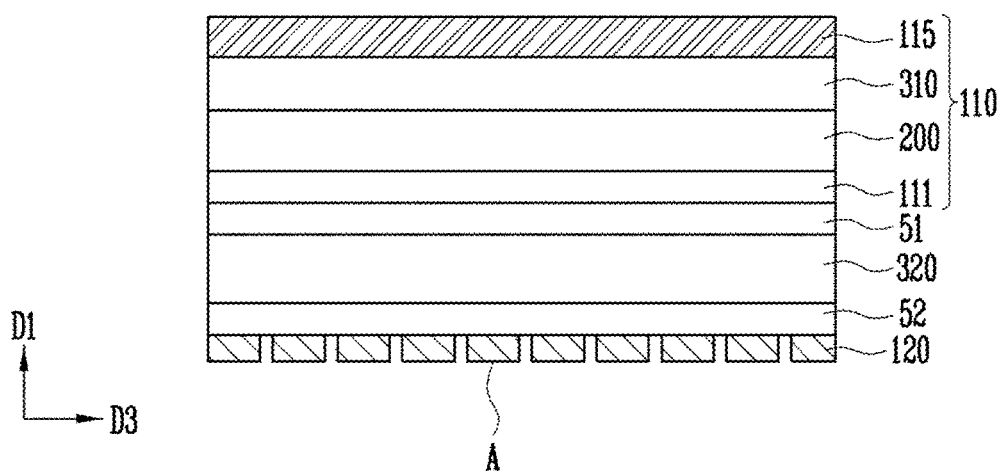
FIG. 11B is a cross-sectional view illustrating another exemplary embodiment of the display unit illustrated in FIG. 8.

FIG. 11B is a cross-sectional view illustrating another exemplary embodiment of the display unit illustrated in FIG. 8.

Referring to FIG. 11B, the display panel 110 may include a substrate 111, a display layer 200, and a window 115.

The substrate 111 may be a flexible substrate including a polymeric film. In an exemplary embodiment, the substrate 111 may include, for example, plastic, such as PI, PA, PET, or the like.

The display layer 200 includes elements and lines forming pixels and layers for insulating or protecting the elements and lines. The display layer 200 may include switching elements, such as transistors, and light-emitting elements, such as OLEDs. The detailed structure of the display layer 200 will be described in detail with reference to FIG. 13.

Rubber layers 310 and 320 may be disposed above the display layer 200 and under the substrate 111.

The first rubber layer 310 may include coating-type rubber. In an exemplary embodiment, the first rubber layer 310 may be provided by coating the display layer 200 with rubber and curing the rubber. The first rubber layer 310 is bonded to the display layer 200 while being cured, thereby being bonded to the display layer 200 without the use of a separate adhesive.

The second rubber layer 320 may be provided by laminating a prepared rubber film on the substrate 111 using an adhesive, or may include coating-type rubber, like the first rubber layer 310.

The rubber of the rubber layers 310 and 320 includes highly stretchable rubber. In an exemplary embodiment, the rubber may include, for example, urethane-based rubber such as polyurethane ("PU"), silicon-based rubber such as polydimethylsiloxane ("PDMS"), and/or acryl-based rubber, but the type of rubber is not limited thereto.

With an increase in the number of times the display panel 110 is wound and unwound, the restoring force of the display panel 110 is reduced, whereby the display panel 110 may not be completely unwound, or may not be flat although it is unwound. In an exemplary embodiment of the invention, layers including rubber, which is a material having good restoring force, are disposed on one surface, both surfaces, and/or in the internal layer of the display panel 110, whereby the restoring force of the display panel 110 may be improved.

The rubber layers 310 and 320 may function as a protective layer for absorbing impacts applied to the display panel 110 and for preventing the display panel 110 from being damaged. Here, the first rubber layer 310 and/or the second rubber layer 320 may be optically transparent in order to prevent an image displayed on the display panel 110 from being blocked. Unlike the illustrated exemplary embodiment, at least one of the rubber layers 310 and 320 may be omitted. In such an exemplary embodiment, the adhesive layers AD1 and AD2 illustrated in FIG. 11A may be disposed so as to replace at least one of the rubber layers 310 and 320.

The window 115 may be disposed above the first rubber layer 310. The window 115 provides a desirable surface characteristic of the display panel 110 while protecting the underlying layers and the display panel 110. The uncured first rubber layer 310 is disposed between the display panel 110 and the window 115 and is then cured, whereby the window 115 may be bonded to the first rubber layer 310. In an alternative exemplary embodiment, the window 115 may be bonded to the first rubber layer 310 using a separate adhesive such as a PSA. A touch screen panel (not illustrated) may be placed between the first rubber layer 310 and the window 115. The touch screen panel may be disposed on one surface of the window 115, for example, the surface that is in contact with the first rubber layer 310.

The support member 120 is disposed under the second rubber layer 320. The structure of the support member 120 is as described above. That is, the support member 120 may be provided with areas A disposed along the third directional axis D3.

In various exemplary embodiments of the invention, a first elastic gel layer 51 may be placed between the display panel 110 and the second rubber layer 320, and a second elastic gel layer 52 may be placed between the second rubber layer 320 and the support member 120. In an exemplary embodiment, each of the elastic gel layers 51 and 52 may have toughness of, for example, about 9000 Joules per square meter ($J/m^2$) or less or toughness of about 5000 to about 9000 $J/m^2$. The elastic gel layers 51 and 52 have higher toughness or fracture energy than a layer including general gel. To this end, the elastic gel layers 51 and 52 may include a highly stretchable and restorable material, that is, so-called 'tough gel'. The tough gel may include hydrogel and/or organogel. In an exemplary embodiment, the tough gel may include, for example, hybrid gel including polyacrylamide gel and alginate gel, but the tough gel is not limited thereto.

The elastic gel layers 51 and 52 may have adhesiveness through surface treatment. Accordingly, the support member 120 or the second rubber layer 320 may be bonded through the elastic gel layers 51 and 52 without using an adhesive such as a PSA, an OCA, or the like. An adhesive such as a PSA or an OCA has weak restoring force. Therefore, when a layer including an adhesive, such as a PSA or an OCA, is included, it may adversely affect the planarization of the display unit DP when the display unit DP is unwound.

In an exemplary embodiment of the invention, it is not necessary to use an adhesive in order to bond the support member 120. Also, because the elastic gel layers 51 and 52 have high restoring force, even though the display unit DP is repeatedly wound and unwound over a long period of time, the flatness of the display unit DP and the display panel 110 thereof may be maintained. That is, the elastic gel layers 51 and 52 may impart a restoration characteristic for the high flatness of the display panel 110 to the display unit DP.

Figure 11C:
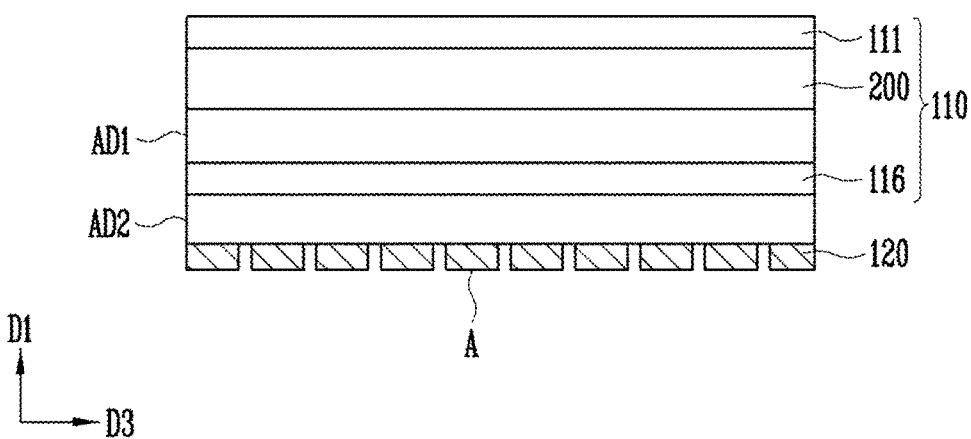
FIG. 11C is a cross-sectional view illustrating a further exemplary embodiment of the display unit illustrated in FIG. 8.

FIG. 11C is a cross-sectional view illustrating a further exemplary embodiment of the display unit illustrated in FIG. 8.

Referring to FIG. 11C, the display panel 110 includes a substrate 111, a display layer 200, and an encapsulation substrate 116.

The substrate 111 is a base member for supporting various configurations of the display panel 110, and may include an insulation material. The substrate 111 may include a flexible material in order to enable the display panel 110 to be wound or unwound, and may include, for example, a plastic material, such as PI, PA, PET, or the like.

The display layer 200 includes elements and lines forming pixels and layers for insulating or protecting the elements and lines. The display layer 200 may include switching elements, such as transistors, and light-emitting elements, such as OLEDs. The detailed structure of the display layer 200 will be described in detail with reference to FIG. 13.

The encapsulation substrate 116 may be disposed under the display layer 200. The encapsulation substrate 116 protects the elements and lines forming the pixels and the layers for insulating or protecting the elements and lines. In an exemplary embodiment, the encapsulation substrate 116 may include a metal material, such as aluminum (Al), nickel (Ni), chromium (Cr), an alloy of iron (Fe) and nickel (Ni), or the like, which is highly corrosion-resistant and easily fabricated in the form of foil or a thin film. When the encapsulation substrate 116 includes a metal material, it may be implemented in the form of an ultrathin film, and protection against external shocks and scratches may be provided.

A first adhesive layer AD1 may be disposed between the display layer 200 and the encapsulation substrate 116. The first adhesive layer AD1 may bond the display layer 200 and the encapsulation substrate 116. The first adhesive layer AD1 includes an adhesive material, and may be a thermosetting or self-curing adhesive. In an exemplary embodiment, the first adhesive layer AD1 may include an OCA, a PSA or the like, for example, but the first adhesive layer AD1 is not limited thereto.

A support member 120 is disposed under the encapsulation substrate 116. The support member 120 may be disposed so as to be in contact with the encapsulation substrate 116 of the display panel 110. The structure of the support member 120 is as described above. That is, the support member 120 may be provided with areas A disposed along the third directional axis D3. In various exemplary embodiments, the support member 120 may be bonded to the display panel 110 by a second adhesive layer AD2.

In such an exemplary embodiment, the second adhesive layer AD2 is disposed between the encapsulation substrate 116 and the support member 120. The second adhesive layer AD2 may bond the encapsulation substrate 116 and the support member 120. The second adhesive layer AD2 includes an adhesive material, and may be a thermosetting or self-curing adhesive. In an exemplary embodiment, the second adhesive layer AD2 may include an OCA, a PSA or the like, for example, but the second adhesive layer AD2 is not limited thereto.

In another exemplary embodiment of the invention, the support member 120 may be joined to the display panel 110 using a physical coupling method, and may be detachable from the display panel 110. In such an exemplary embodiment, the second adhesive layer AD2 may be omitted.

Figure 12:
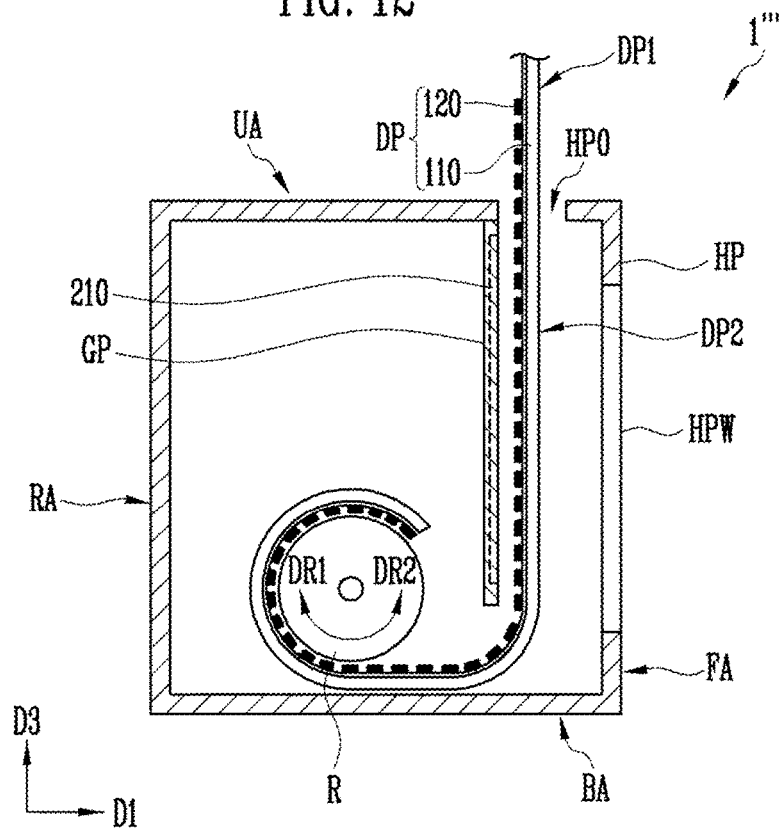
FIG. 12 is a cross-sectional side view of yet another exemplary embodiment of a display device according to the invention.
Figure 13A:
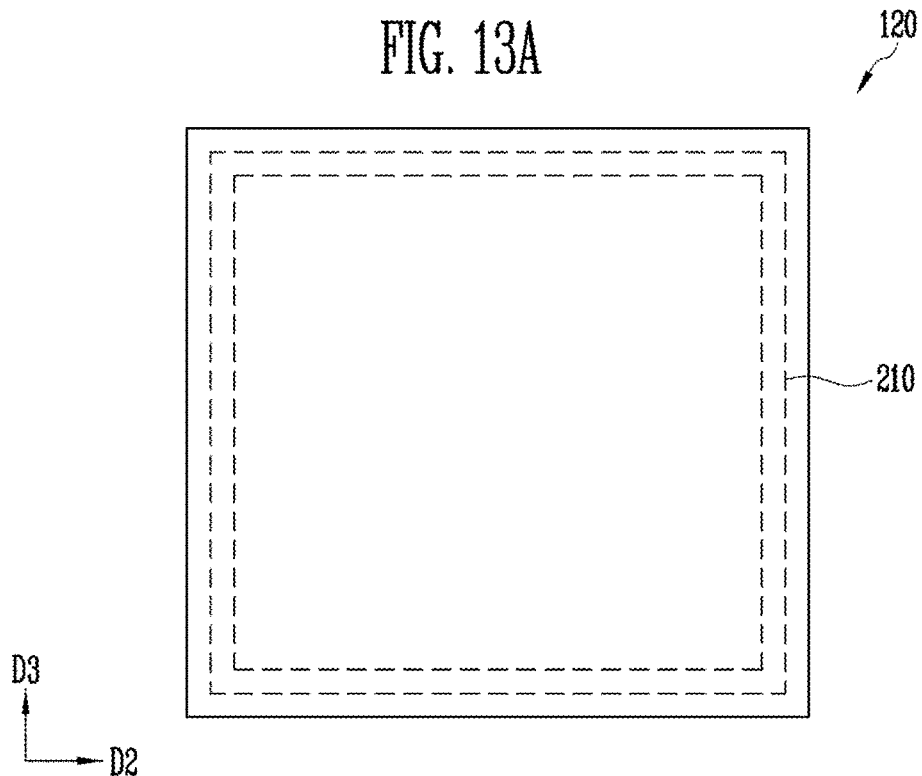
Figure 14:
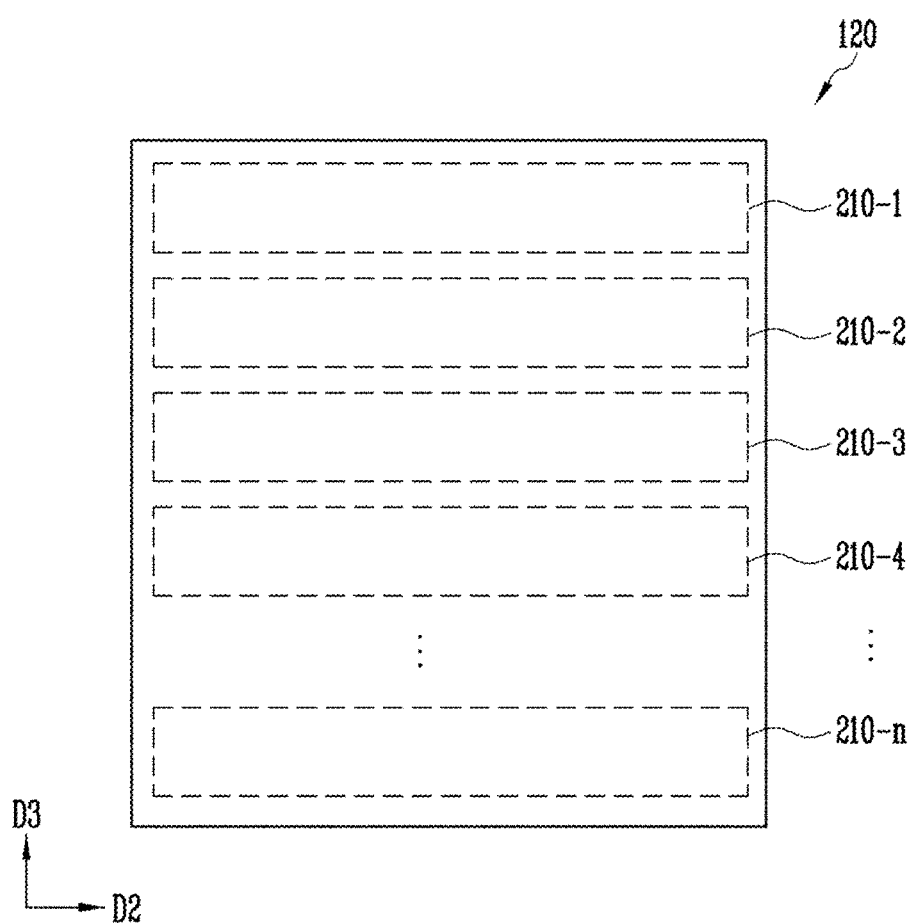
FIG. 14 is a front view illustrating another exemplary embodiment of the magnetic part illustrated in FIG. 12.

FIG. 12 is a cross-sectional side view of yet another exemplary embodiment of a display device according to the invention. FIGS. 13A to 13C are front views illustrating an exemplary embodiment of the magnetic part illustrated in FIG. 12. FIG. 14 is a front view illustrating another exemplary embodiment of the magnetic part illustrated in FIG. 12. The display device 1''' of FIG. 12 is the same as the display device 1'' of FIG. 8 except that the at least one area of the guide member GP has a magnetic property, and thus a repeated description will be omitted.

Referring to FIG. 12, the guide member GP may include a magnetic part 210 having a magnetic property in at least one area thereof. In an exemplary embodiment, the magnetic part 210 includes an electromagnet, a coil, or the like, and may be provided so as to adjust the strength of magnetic force by regulating the amount of current supplied thereto.

In an exemplary embodiment, while the display unit DP is being wound or unwound along the guide member GP, no current is supplied to the magnetic part 210, whereby the strength of the magnetic force of the magnetic part 210 may become zero, for example. That is, while the display unit DP is moving upwards or downwards, the magnetic part 210 may be controlled so as to maintain a turn-off state.

Also, for example, while the display unit DP is fixed without being wound and unwound, the magnetic part 210 may have constant magnetic force by being supplied with current. That is, while the display unit DP is not moving, the magnetic part 210 may be controlled so as to maintain a turn-on state.

The support member 120, including a metal material, may be joined to the magnetic part 210 by the magnetic force of the magnetic part 210. By joining the support member 120 and the magnetic part 210, the display panel 110 joined to the support member 120 may be firmly supported and maintain a flat shape. Particularly, when the display unit DP is fully unwound or fully wound, a partial area visible from the outside through the window HPW of the housing HP maintains a flat state by joining the support member 120 and the magnetic part 210, whereby visibility may be improved.

The magnetic part 210 may be disposed over the entire area of the support member 120. In an alternative exemplary embodiment, the magnetic part 210 may be provided by being patterned in at least one area of the support member 120. In an exemplary embodiment in which the guide member GP is provided as a single extension part GP1 as illustrated in FIG. 3, the magnetic part 210 may be disposed along the edges of the support member 120 on the support member 120 so as to correspond to the edges of the extension part GP1, as illustrated in FIG. 13A, for example.

In an alternative exemplary embodiment, when the guide member GP is provided with two extension parts GP1 and GP2 as illustrated in FIG. 4, the magnetic part 210 may be provided with magnetic parts 210-1 and 210-2 on the support member 120 so as to correspond to the respective extension parts GP1 and GP2. In an alternative exemplary embodiment, when the guide member GP is provided with four extension parts GP1 to GP4 as illustrated in FIG. 5, the magnetic part 210 may be provided with magnetic parts 210-1 to 210-4 on the support member 120 so as to correspond to the respective extension parts GP1 to GP4.

In an alternative exemplary embodiment, when the support member 120 has the multi joint structure illustrated in FIG. 10, the magnetic part 210 may include magnetic parts 210-1, 210-2, 210-3, 201-4, . . . , 210-n (n is a natural number greater than four), which are patterned so as to correspond to the areas A of the support member 120, as illustrated in FIG. 14.

The pattern of the magnetic part 210 is not limited to the examples illustrated in FIGS. 13A to 13C and 14. That is, as long as the magnetic part 210 is able to support the flat shape of the display unit DP by being joined to the support member 120, the magnetic part 210 may be variously patterned depending on the shape and size of the support member 120.

When the magnetic part 210 is patterned, the respective patterns of the magnetic part 210 may be individually supplied with current. Accordingly, the respective patterns of the magnetic part 210 may be controlled so as to have different strengths of magnetic force. In an exemplary embodiment, when the magnetic part 210 is controlled so as to be in a turn-on state, control may be performed such that the magnetic force of the pattern disposed at the bottom and the pattern disposed at the top, among the patterns of the magnetic part 210, is stronger than that of the remaining patterns, for example. However, the technical spirit of the invention is not limited to this example, and the strength of the magnetic force of the patterns of the magnetic part 210 may be controlled using any of various methods.

Figure 15A:
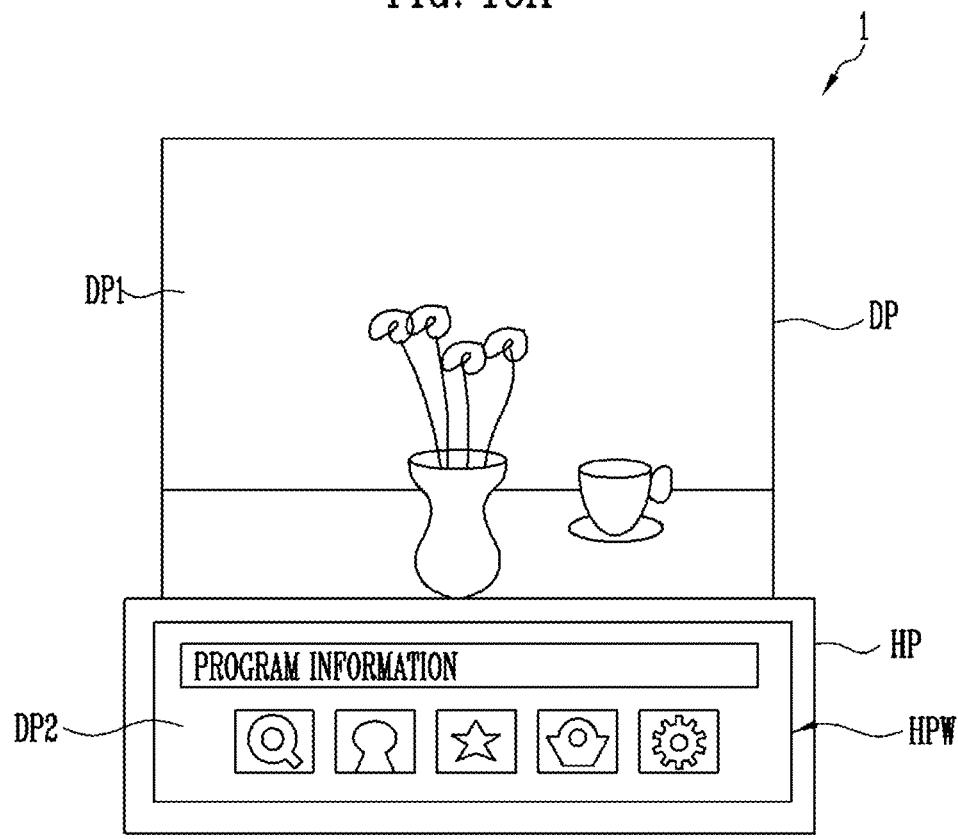
FIGS. 15A and 15B are views illustrating an exemplary embodiment of a display screen of a display device according to the invention.
Figure 15B:
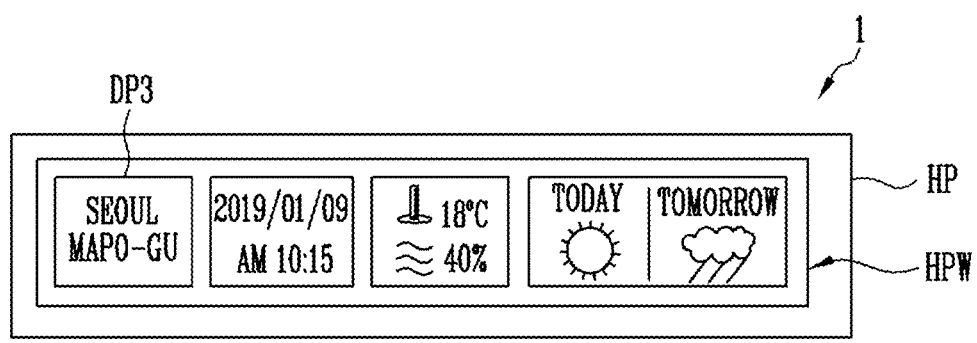

FIGS. 15A and 15B are views illustrating an exemplary embodiment of a display screen of a display device according to the invention.

In various exemplary embodiments of the invention, when the display unit DP is unwound, the display device 1 may display different images in a first area DP1, disposed outside a housing HP, and a second area DP2, disposed inside the housing HP and corresponding to the window HPW of the housing HP. Also, when the display unit DP is wound, the display device 1 may display an image for a user in a third area DP3 disposed inside the housing HP and corresponding to the window HPW of the housing HP. Here, the third area DP3 may correspond to at least one part of the first area DP1.

In an exemplary embodiment, when the display unit DP is unwound, as illustrated in FIG. 15A, the display device 1 may display the content image selected by a user in the first area DP1 disposed outside the housing HP. Here, the display device 1 may display information related to the displayed content and/or information related to a service provided for user convenience in the second area DP2, which is disposed inside the housing HP but is visible from the outside through the window HPW of the housing HP.

The image displayed in the second area DP2 may be, for example, information about the content that is being displayed, which may include a channel, a title, a playback time, and the like. In an alternative exemplary embodiment, the image displayed in the second area DP2 may include, for example, a graphical user interface ("GUI") for content search, user-customized content, favorites, shopping, entertainment, settings of the display device, and the like as a service provided for user convenience. However, the image displayed in the second area DP2 is not limited to these examples.

In an exemplary embodiment, when the display unit DP is wound, as illustrated in FIG. 15B, the display device 1 may display information provided for user convenience, and the like in the third area DP3 disposed inside the housing HP The image displayed in the third area DP3 may include, for example, position information, date information, time information, weather information, information about the playing content (music, radio broadcasting, or the like), and the like. However, the image displayed in the third area DP3 is not limited to the above-described examples.

In various exemplary embodiments, the third area DP3 may display an image in an AoD mode. Accordingly, as long as power is supplied to the display device 1, the image displayed in the third area DP3 is always visible to a user through the window HPW.

Figure 16A:
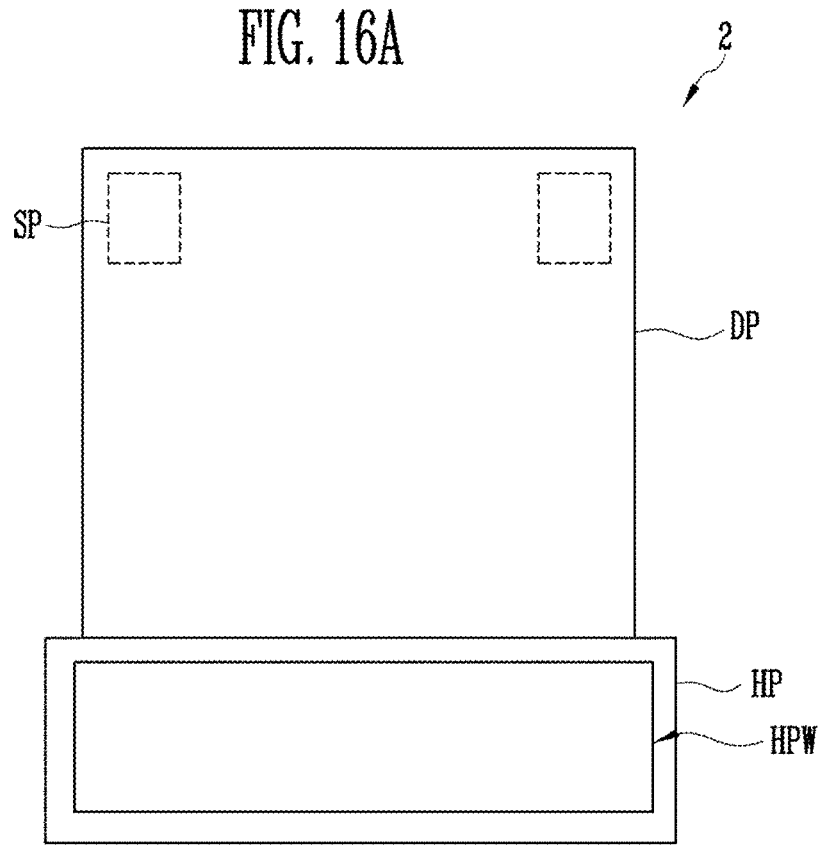
FIGS. 16A and 16B are front views of still another exemplary embodiment of a display device according to the invention.
Figure 16B:
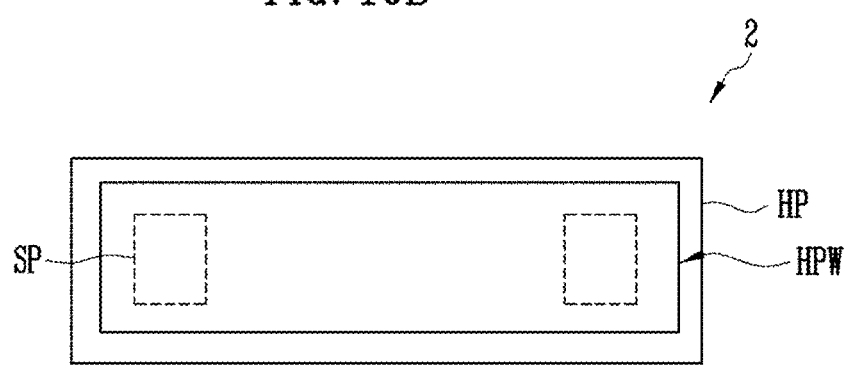
Figure 17:
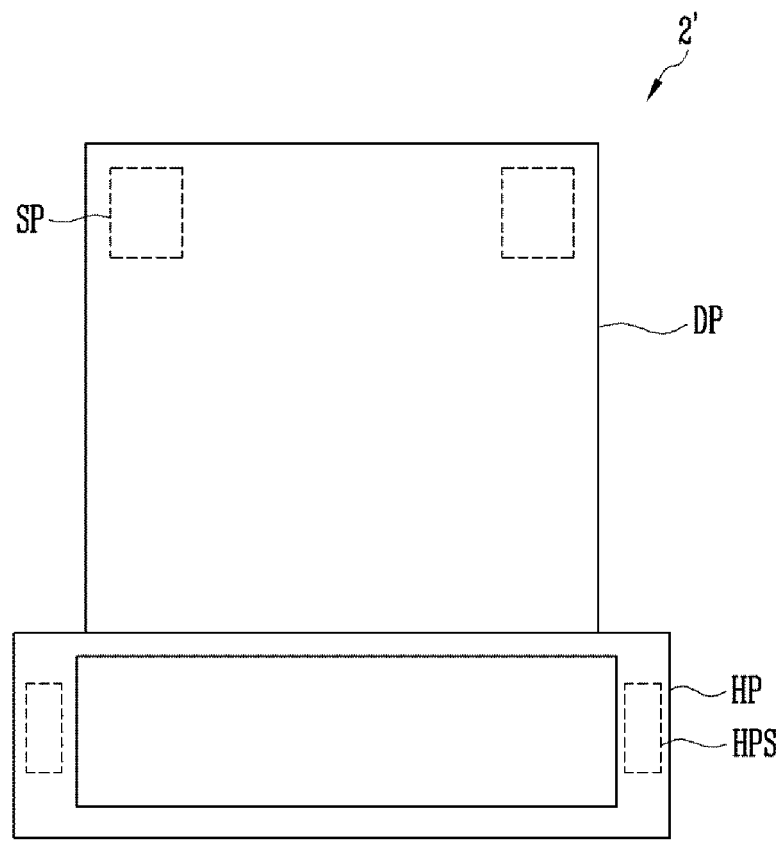
FIG. 17 is a front view of still another exemplary embodiment of a display device according to the invention.

FIGS. 16A and 16B are front views of a display device according to still another exemplary embodiment of the invention. FIG. 17 is a front view of a display device according to still another exemplary embodiment of the invention.

Referring to FIGS. 16A and 16B, the display device 2 according to still another exemplary embodiment of the invention may further include a speaker SP integrated into the display unit DP. In an exemplary embodiment, the speaker SP may be disposed as a separate layer on the rear surface of the display panel 110 illustrated in FIG. 8. In such an exemplary embodiment, a vibration transmission member, an adhesive member, a fixing member, and the like may be further provided between the display panel 110 and the speaker SP. However, the disposition of the speaker SP is not limited to the above example.

When the display unit DP is unwound, at least one area thereof may be disposed outside the housing HP. Here, the speaker SP integrated into the display unit DP is also disposed outside the housing HP, thereby outputting sound to the outside.

When the display unit DP is fully wound, the speaker SP may be disposed at the upper part of the display unit DP such that sound is transmitted to the outside through the opening HPO of the housing HP and/or through vibration of the housing HP. FIGS. 16A and 16B illustrate an example in which the built-in speakers SP are disposed at the opposite sides of the upper part of the display unit DP, but the number and disposition of speakers SP are not limited to the illustrated example.

When the display unit DP is fully wound and the entire area thereof is disposed inside the housing HP, sound output via the speaker SP, disposed at the upper part of the display unit DP, may be transmitted to the outside through the opening HPO or vibration of the housing HP. In such an exemplary embodiment, the display device 2 may function as a sound box.

In an exemplary embodiment of the invention, the display device 2' may further include a speaker HPS provided in the housing HP, as illustrated in FIG. 17. The speaker HPS provided in the housing HP may be controlled so as to operate in conjunction with the speaker SP integrated into the display unit DP or to individually operate. In an exemplary embodiment, when the display unit DP is unwound and disposed outside the housing HP, the sound of video may be output via the speaker SP integrated into the display unit DP, but when the display unit DP is wound and disposed inside the housing HP, sound may be output via the speaker HPS provided in the housing HP, for example. However, the technical spirit of the invention is not limited to this example.

In another exemplary embodiment, the display device 2 has only the speaker HPS provided in the housing HP, and a built-in speaker may not be provided in the display unit DP.

Figure 18:
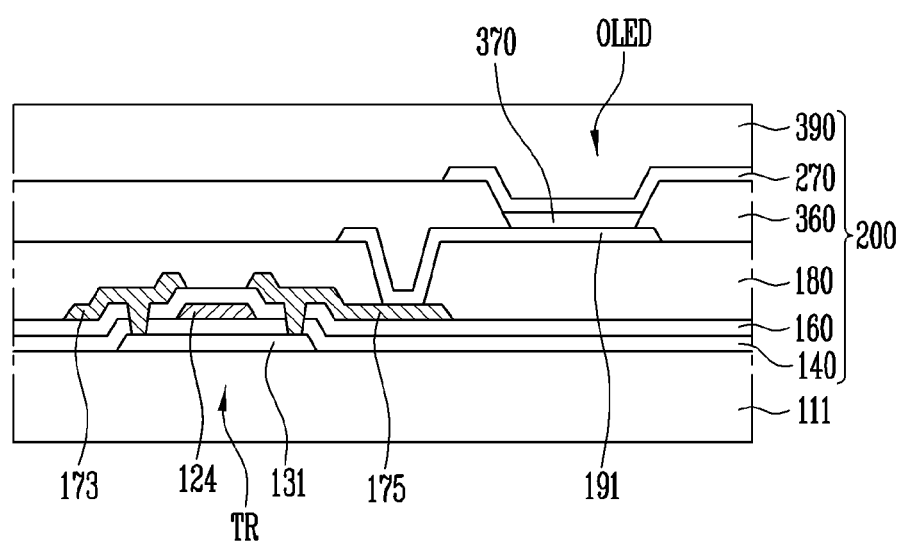
FIG. 18 is a cross-sectional view illustrating an exemplary embodiment of the stacked structure of a display unit according to the invention.

FIG. 18 is a cross-sectional view illustrating an exemplary embodiment of a stacked structure of a display unit according to the invention. Specifically, FIG. 18 illustrates the detailed structure of the substrate 111 illustrated in FIGS. 11A to 11C and the display layer 200 stacked on the substrate 111.

Referring to FIG. 18, pixels (not illustrated) are disposed on the display layer 200. Each of the pixels includes transistors and an OLED. In FIG. 18, the stacked structure of the display layer 200 is described based on a single transistor TR and a single OLED coupled thereto.

In the substrate 111 and/or on the substrate 111, a buffer layer (not illustrated) or a barrier layer (not illustrated) for preventing impurities, which deteriorate the characteristics of a semiconductor, from diffusing and for preventing moisture or the like from permeating, may be disposed. In an exemplary embodiment, such a buffer layer may be provided as a single layer or multiple layers of silicon oxide ($SiO_x$) and silicon nitride ($SiN_x$), but the buffer layer is not limited thereto.

The semiconductor 131 of the transistor TR is disposed on the substrate 111, and a gate insulation layer 140 is disposed on the semiconductor 131. The semiconductor 131 includes a source region, a drain region, and a channel region therebetween. In an exemplary embodiment, the semiconductor 131 may include polycrystalline silicon, an oxide semiconductor, or amorphous silicon, for example. In an exemplary embodiment, the gate insulation layer 140 may include an inorganic insulation material, such as silicon oxide, silicon nitride, and the like.

A gate conductor including the gate electrode 124 of the transistor TR is disposed on the gate insulation layer 140. In an exemplary embodiment, the gate conductor may include, for example, metal such as copper (Cu), aluminum (Al), silver (Ag), molybdenum (Mo), chromium (Cr), tantalum (Ta), titanium (Ti), and the like, or an alloy thereof.

An interlayer insulation layer 160 is disposed on the gate conductor. The interlayer insulation layer 160 may include an inorganic material.

A data conductor including the source electrode 173 and the drain electrode 175 of the transistor TR is disposed on the interlayer insulation layer 160. The source electrode 173 and the drain electrode 175 are coupled to the source region and the drain region of the semiconductor 131, respectively, through contact holes defined in the interlayer insulation layer 160 and the gate insulation layer 140. In an exemplary embodiment, the data conductor may include, for example, metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), nickel (Ni), and the like, or an alloy thereof.

A passivation layer 180 is disposed on the data conductor. The passivation layer 180 may include an organic material. A pixel electrode 191 is disposed on the passivation layer 180. The pixel electrode 191 is coupled to the drain electrode 175 through a contact hole defined in the passivation layer 180, thereby receiving a data signal for controlling the luminance of the OLED.

A pixel definition layer 360 is disposed on portions of the passivation layer 180 and the pixel electrode 191. An opening that overlaps the pixel electrode 191 is defined in the pixel definition layer 360. In the opening of the pixel definition layer 360, an emission layer 370 is disposed on the pixel electrode 191, and a common electrode 270 is disposed on the emission layer 370. The pixel electrode 191, the emission layer 370, and the common electrode 270 form an OLED. The pixel electrode 191 may be the anode of the OLED, and the common electrode 270 may be the cathode thereof. In an exemplary embodiment, the common electrode 270 may include a transparent conductive material, such as indium tin oxide ("ITO") and indium zinc oxide ("IZO").

An encapsulation layer 390 for protecting the OLED is disposed on the common electrode 270. The encapsulation layer 390 may include at least one organic material layer and/or at least one inorganic material layer. In an exemplary embodiment, the encapsulation layer 390 may be disposed in such a way that multiple inorganic material layers and multiple organic material layers are alternately stacked, for example. In an exemplary embodiment, the inorganic material layer may include inorganic materials, such as silicon nitride ($SiN_x$), silicon oxide ($SiO_x$), aluminum oxide ($AlO_x$), and the like, and the organic material layer may use epoxy-based or acryl-based polymer, for example, but the inorganic material layer and the organic material layer are not limited thereto.

In the above description, an example in which the display panel 110 is an organic light-emitting display panel has been described, but the display panel 110 may be, for example, a liquid crystal display panel including a liquid crystal layer.

Exemplary embodiments of a display device according to the invention may display and provide brief information through a transparent window disposed in the housing of the rollable display device.

Exemplary embodiments of a display device according to the invention enable a display unit to maintain a flat state without bumps when the display unit is wound or unwound.

Exemplary embodiments of a display device according to the invention enable a display unit to be guided along the front surface of a housing when the display unit is wound or unwound, thereby preventing the display unit from deviating a designed position.

While the exemplary embodiments of the invention have been described in detail with reference to the drawings, it will be understood by those skilled in the art that the invention may be implemented in other specific forms without changing the technical spirit or essential features of the invention. Therefore, it should be noted that the forgoing embodiments are merely illustrative in all exemplary embodiments and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A display device, comprising: a display unit which displays an image; a roller to which an end of the display unit is fixed and which winds or unwinds the display unit by rotating; a housing which accommodates the display unit and the roller; and a guide member which extends from a top surface of the housing defining an opening to inside the housing and guides a movement of the display unit inside the housing, wherein the guide member is fixed inside the housing to be adjacent to and facing a front surface of the housing, the guide member is overlapped with the roller viewed from the front surface, and the display unit is capable of moving in a vertical upward and vertical downward directions in a state in which the display unit is tightly close to the front surface of the housing, and wherein the display unit remains flat in the unwound state when exposed outside the housing extended in the vertical upward direction, and the display unit is not contacted with the guide member at an outside of the housing extended in the vertical upward direction; and the housing includes a window including a transparent material and provided on the front surface of the housing; and the display unit displays a piece of information in a first area, disposed adjacent to the window inside the housing, when the display unit is wound and a different piece of information in a second area through the window.

2. The display device according to claim 1, wherein the guide member includes an extension part extending in a direction from a first side to a second side of the housing.

3. The display device according to claim 2, wherein the guide member further includes a first extension part extending in a direction from an upper side to a lower side of the housing.

4. The display device according to claim 3, wherein the guide member further includes a second extension part extending in a direction from a first side surface to a second side surface of the housing.

5. The display device according to claim 1, wherein the first area is driven in an always-on-display mode.

6. A display device, comprising: a display unit which displays an image; a roller to which an end of the display unit is fixed which winds or unwinds the display unit by rotating; a housing which accommodates the display unit and the roller, the housing including a window including a transparent material on a surface thereof; and a guide member which extends from a side of the housing defining an opening to inside the housing and guides a movement of the display unit inside the housing, wherein the guide member is fixed inside the housing to be adjacent to and facing a front surface of the housing, and the display unit is capable of moving in a vertical upward and vertical downward directions in a state in which the display unit is tightly close to the front surface of the housing, and wherein the display unit remains flat in the unwound state when exposed outside the housing extended in the vertical upward direction, and the display unit is not contacted with the guide member at an outside of the housing extended in the vertical upward direction; and the housing includes a window including a transparent material and provided on the front surface of the housing; and the display unit displays a piece of information in a first area, disposed adjacent to the window inside the housing, when the display unit is wound and a different piece of information in a second area through the window.

7. The display device according to claim 6, wherein the guide member is provided in plural and the plurality of guide members are provided inside the housing and guide the upward and downward movement of the display unit.

8. The display device according to claim 7, wherein the display unit is guided to move between the surface of the housing and the plurality of guide members.

9. The display device according to claim 1, wherein an inside of the housing is partitioned by the guide member into a first space and a second space, wherein the roller is disposed in the first space of the housing, and wherein the opening is disposed adjacent to the second space than the first space.

* * * * *